US010598752B2

(12) United States Patent
Jeong et al.

(10) Patent No.: US 10,598,752 B2
(45) Date of Patent: Mar. 24, 2020

(54) MAGNETIC RESONANCE IMAGING (MRI) APPARATUS AND METHOD OF OBTAINING MAGNETIC RESONANCE IMAGE

(71) Applicants: SAMSUNG ELECTRONICS CO., LTD., Suwon-si (KR); SEOUL NATIONAL UNIVERSITY R&DB FOUNDATION, Seoul (KR)

(72) Inventors: Jin-hee Jeong, Yongin-si (KR); Jongho Lee, Seoul (KR)

(73) Assignees: SAMSUNG ELECTRONICS CO., LTD., Suwon-si (KR); SEOUL NATIONAL UNIVERSITY R&DB FOUNDATION, Seoul (KR)

(*) Notice: Subject to any disclaimer, the term of this patent is extended or adjusted under 35 U.S.C. 154(b) by 155 days.

(21) Appl. No.: 15/807,800

(22) Filed: Nov. 9, 2017

(65) Prior Publication Data

US 2018/0128891 A1    May 10, 2018

(30) Foreign Application Priority Data

Nov. 9, 2016  (KR) ......................... 10-2016-0148880
Oct. 31, 2017  (KR) ......................... 10-2017-0143103

(51) Int. Cl.
*G01V 3/00* (2006.01)
*G01R 33/56* (2006.01)
(Continued)

(52) U.S. Cl.
CPC ...... *G01R 33/5602* (2013.01); *G01R 33/4835* (2013.01); *G01R 33/561* (2013.01)

(58) Field of Classification Search
CPC ............ G01R 33/543; G01R 33/5659; G01R 33/3415; G01R 33/36; A61B 5/055
(Continued)

(56) References Cited

U.S. PATENT DOCUMENTS

| 5,406,203 A | 4/1995 | Oh et al. |
| 6,850,793 B1 * | 2/2005 | Miyazaki ............... G01R 33/54 |
| | | 324/307 |

(Continued)

FOREIGN PATENT DOCUMENTS

| KR | 10-2014-0025823 A | 3/2014 |
| KR | 10-2014-0059936 A | 5/2014 |

OTHER PUBLICATIONS

Communication dated May 15, 2018, from the European Patent Office in counterpart European Application No. 17200706.4.
(Continued)

*Primary Examiner* — Walter L Lindsay, Jr.
*Assistant Examiner* — Frederick Wenderoth
(74) *Attorney, Agent, or Firm* — Sughrue Mion, PLLC

(57) ABSTRACT

Provided are a magnetic resonance imaging (MRI) apparatus and method for obtaining a plurality of MR images having different contrasts by using a single pulse sequence. The MRI apparatus includes a controller configured to control a pulse sequence of one cycle to be applied to a plurality of slices of an object, wherein the one cycle includes a first obtaining section during which a first inversion radio frequency (RF) pulse is applied to a first slice of the object and a second obtaining section during which a second inversion RF pulse is applied to a second slice of the object adjacent to the first slice, and to sequentially obtain a first MR signal for capturing a first MR image of the first slice, a second MR signal for capturing at least one second MR image of the second slice adjacent to the first slice, and a third MR signal for capturing at least one third MR image of the first slice, during the first obtaining section.

20 Claims, 8 Drawing Sheets

(51) Int. Cl.
*G01R 33/561* (2006.01)
*G01R 33/483* (2006.01)

(58) Field of Classification Search
USPC .......................................................... 324/309
See application file for complete search history.

(56) References Cited

U.S. PATENT DOCUMENTS

| | | | |
|---|---|---|---|
| 2005/0033151 A1* | 2/2005 | Wu | G01R 33/50 |
| | | | 600/410 |
| 2005/0215881 A1 | 9/2005 | Van Zijl et al. | |
| 2011/0181285 A1 | 7/2011 | Greiser | |
| 2011/0210733 A1* | 9/2011 | Wheaton | G01R 33/5607 |
| | | | 324/309 |
| 2012/0046539 A1 | 2/2012 | Visser | |
| 2013/0307542 A1* | 11/2013 | Chen | G01R 33/5613 |
| | | | 324/318 |
| 2013/0310678 A1* | 11/2013 | Balbi | A61B 5/055 |
| | | | 600/410 |
| 2013/0314086 A1* | 11/2013 | Li | G01R 33/56509 |
| | | | 324/309 |
| 2016/0299205 A1 | 10/2016 | Choi et al. | |

OTHER PUBLICATIONS

John Listerud et al. "Oil Flair: Optimized Interleaved Fluid-Attenuated Inversion Recovery in 2D Fast Spin Echo" Magnetic Resonance in Medicine, vol. 36, No. 2, Aug. 1, 1996 (pp. 320-325) XP055470212.

Notice of Allowance dated May 7, 2019 by the Korean Intellectual Property Office in counterpart Korean Patent Application No. 10-2017-0143103.

* cited by examiner

MAGNETIC RESONANCE IMAGING (MRI) APPARATUS AND METHOD OF OBTAINING MAGNETIC RESONANCE IMAGE

CROSS-REFERENCE TO RELATED APPLICATION

This application claims the benefits of Korean Patent Application No. 10-2016-0148880, filed on Nov. 9, 2016, and Korean Patent Application No. 10-2017-0143103, filed on Oct. 31, 2017, in the Korean Intellectual Property Office, the disclosures of which are incorporated herein in their entirety by reference.

BACKGROUND

1. Field

The present disclosure relates to a magnetic resonance imaging (MRI) apparatus and an MRI method. More particularly, the present disclosure relates to an MRI apparatus for obtaining a plurality of MR images having different contrasts by using a single pulse sequence, and a method of obtaining an MR image.

2. Description of the Related Art

MRI apparatuses are apparatuses for capturing images of a subject by using a magnetic field, and are widely used to accurately diagnose a disease since the MRI apparatuses three-dimensionally show not only bones, but also discs, joints, nerves, and ligaments at a desired angle.

Images having mutually different contrasts may be used to diagnose a disease. For example, a T1 weighted image, a T2 weighted image, a T2* weighted image, a fluid attenuated inversion recovery (FLAIR) image, and a proton density (PD) weighted image may be used. The images having mutually different contrasts may be obtained by adjusting an echo time (TE) and a repetition time (TR). Prior art related to a method of obtaining images having mutually different contrasts includes US 2010-0013475.

In the conventional art, a plurality of pulse sequences corresponding to a plurality of contrasts need to be applied in order to obtain MR images having mutually different contrasts. However, it may take a long time to obtain images having mutually different contrasts for a plurality of slices, and inconvenience to patients may increase.

Moreover, because images of different contrasts are obtained at different time points, when images having different contrasts for an identical slice are compared with each other, lesions included in the images for the identical slice may be different from each other if a movement of an organ has occurred between the times that the images are obtained.

SUMMARY

Embodiments include reducing a scan time period by obtaining a plurality of magnetic resonance (MR) images having different contrasts by using a single pulse sequence.

Embodiments also include obtaining images having different contrasts for a plurality of cross-sections by stimulating the plurality of cross-sections by using a single pulse sequence according to a multi-band imaging method.

Additional aspects will be set forth in part in the description which follows and, in part, will be apparent from the description, or may be learned by practice of the presented embodiments.

According to an aspect of an embodiment, a magnetic resonance imaging (MRI) apparatus includes a controller configured to control a pulse sequence of one cycle to be applied to a plurality of slices of an object, wherein the one cycle includes a first obtaining section during which a first inversion radio frequency (RF) pulse is applied to a first slice of the object and a second obtaining section during which a second inversion RF pulse is applied to a second slice of the object adjacent to the first slice, and to sequentially obtain a first MR signal for capturing a first MR image of the first slice, a second MR signal for capturing at least one second MR image of the second slice adjacent to the first slice, and a third MR signal for capturing at least one third MR image of the first slice, during the first obtaining section. The first MR image, the at least one second MR image, and the at least one third MR image are images having mutually different contrasts.

The controller may be further configured to obtain the first MR signal based on a gradient echo (GRE) signal, and the first MR image may include a T2* weighted image.

The second MR signal may be obtained during an inversion time based on the first inversion RF pulse.

The at least one second MR image may include a proton density (PD) image and a T2 weighted image, and the controller may be further configured to obtain the second MR signal according to a dual echo sequence and obtain the PD image and the T2 weighted image by view-sharing the second MR signal.

The at least one third MR image may include an inversion recovery proton density (PDIR) image and a fluid attenuated inversion recovery (FLAIR) image. The controller may be further configured to obtain the third MR signal according to a dual echo sequence and to obtain the PDIR image and the FLAIR image by view-sharing the third MR signal.

The controller may be further configured to obtain the third MR signal after an inversion time TI terminates and before the second obtaining section starts.

The first obtaining section may be included in a first half of a repetition time (TR), and the second obtaining section may be included in a second half of the TR.

The controller may be further configured to sequentially obtain a fourth MR signal for capturing a fourth MR image of the second slice, a fifth MR signal for capturing at least one fifth MR image of the first slice, and a sixth MR signal for capturing a sixth MR image of the second slice, during the second obtaining section.

The controller may be further configured to obtain the fourth MR signal based on a GRE signal, and the fourth MR image may include a T2* weighted image.

The fifth MR signal may be obtained during an inversion time based on the second inversion RF pulse.

The at least one fifth MR image may include a PD image and a T2 weighted image, and the controller may be further configured to obtain the fifth MR signal according to a dual echo sequence and obtain the PD image and the T2 weighted image by view-sharing the fifth MR signal.

The at least one sixth MR image may include a PDIR image and a FLAIR image, and the controller may be further configured to obtain the sixth MR signal according to a dual echo sequence and to obtain the PDIR image and the FLAIR image by view-sharing the sixth MR signal.

According to an aspect of another embodiment, a method of obtaining an MR image includes controlling a pulse sequence of one cycle to be applied to a plurality of slices of an object, wherein the one cycle includes a first obtaining section during which a first inversion RF pulse is applied to a first slice of the object and a second obtaining section during which a second inversion RF pulse is applied to a second slice of the object adjacent to the first slice. The method also includes, during the first obtaining section, obtaining a first MR signal for capturing a first MR image of the first slice; obtaining a second MR signal for capturing at least one second MR image of the second slice adjacent to the first slice; and obtaining a third MR signal for capturing at least one third MR image of the first slice, wherein the first MR image, the at least one second MR image, and the at least one third MR image are images having mutually different contrasts.

According to an aspect of another embodiment, a computer-readable recording medium has recorded thereon a program for executing the method.

According to an aspect of another embodiment, a magnetic resonance imaging (MRI) apparatus includes a controller configured to control a pulse sequence of one cycle to be applied to a plurality of slices of an object, wherein the one cycle comprises a first obtaining section during which a first inversion radio frequency (RF) pulse is applied to a first slice from among the plurality of slices of the object and a second obtaining section during which a second inversion RF pulse is applied to a second slice from among the plurality of slices of the object, the second slice being adjacent to the first slice, the controller being further configured to sequentially obtain a first MR signal for capturing a first MR image of the first slice, a second MR signal for capturing at least one second MR image of the second slice adjacent to the first slice, and a third MR signal for capturing at least one third MR image of the first slice, wherein the first MR signal, the second MR signal, and the third MR signal are obtained during the first obtaining section. The first MR image, the at least one second MR image, and the at least one third MR image may have mutually different contrasts.

According to an aspect of another embodiment, a method of obtaining an MR image includes controlling a pulse sequence of one cycle to be applied to a plurality of slices of an object, wherein the one cycle comprises a first obtaining section during which a first inversion RF pulse is applied to a first slice from among the plurality of slices of the object and a second obtaining section during which a second inversion RF pulse is applied to a second slice from among the plurality of slices of the object adjacent to the first slice. The method also includes, during the first obtaining section, obtaining a first MR signal for capturing a first MR image of the first slice; obtaining a second MR signal for capturing at least one second MR image of the second slice, the second slice being adjacent to the first slice; and obtaining a third MR signal for capturing at least one third MR image of the first slice, wherein the first MR image, the at least one second MR image, and the at least one third MR image have mutually different contrasts.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
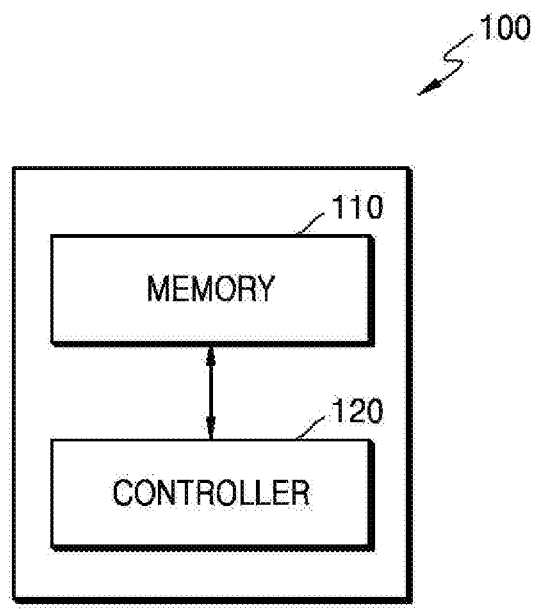
FIG. 1A is a block diagram of a magnetic resonance imaging (MRI) apparatus according to an embodiment of the present inventive concept.

The present specification describes principles of the present disclosure and sets forth embodiments thereof to clarify the scope of the present disclosure and to allow those of ordinary skill in the art to implement the embodiments. The present embodiments may have different forms.

Like reference numerals refer to like elements throughout. The present specification does not describe all components in the embodiments, and common knowledge in the art or the same descriptions of the embodiments will be omitted below. The term "part" or "portion" may be implemented using hardware or software, and according to embodiments, one "part" or "portion" may be formed as a single unit or element or include a plurality of units or elements. Hereinafter, the principles and embodiments of the present disclosure will be described in detail with reference to the accompanying drawings.

In the present specification, an "image" may include a medical image obtained by a magnetic resonance imaging (MRI) apparatus, a computed tomography (CT) apparatus, an ultrasound imaging apparatus, an X-ray apparatus, or another medical imaging apparatus.

Furthermore, in the present specification, an "object" may be a target to be imaged and may include a human, an animal, or a part of a human or animal. For example, the object may include a body part (an organ) or a phantom.

An MRI system acquires an MR signal and reconstructs the acquired MR signal into an image. The MR signal denotes a radio frequency (RF) signal emitted from the object.

In the MRI system, a main magnet creates a static magnetic field to align a magnetic dipole moment of a specific atomic nucleus of the object placed in the static magnetic field along a direction of the static magnetic field. A gradient coil may generate a gradient magnetic field by applying a gradient signal to a static magnetic field and induce resonance frequencies differently according to each region of the object.

An RF coil may emit an RF signal to match a resonance frequency of a region of the object whose image is to be acquired. Furthermore, when gradient magnetic fields are applied, the RF coil may receive MR signals having different resonance frequencies emitted from a plurality of regions of the object. Through this process, the MRI system may obtain an image from an MR signal by using an image reconstruction technique.

FIG. 1A is a block diagram of a magnetic resonance imaging (MRI) apparatus 100 according to an embodiment of the present inventive concept.

The MRI apparatus 100 according to an embodiment is configured to obtain a plurality of MR images having different contrasts.

The MRI apparatus 100 of FIG. 1A may obtain an MR image by performing an MRI scan on an object. The MRI apparatus 100 of FIG. 1A may also obtain an MR image by processing MR data obtained by performing an MRI scan on the object.

For example, the MRI apparatus 100 may apply an RF pulse to the object via a plurality of channel coils included in an RF multi-coil (not shown) and may restore an MR image by using an MR signal obtained via the plurality of channel coils.

The MRI apparatus 100 may be a server that provides a pulse sequence that is to be applied to an object, and restores an MR image by using an MR signal obtained according to the pulse sequence. The server may be a medical server within a hospital where a patient undergoes an MRI scan or another hospital.

Referring to FIG. 1A, the MRI apparatus 100 may include a memory 110 and a controller 120.

The memory 110 may store a pulse sequence that is to be applied to an object. The memory 110 may also store an MR signal obtained based on the pulse sequence.

The controller 120 may provide the pulse sequence. For example, the controller 120 may provide a signal for controlling a waveform generator (not shown) that generates a gradient waveform, namely, a current pulse, according to the pulse sequence, and a signal for controlling a gradient amplifier (not shown) that amplifies the generated current pulse and transmits the amplified current pulse to a scanner (not shown).

The controller 120 may obtain an MR signal, based on the pulse sequence stored in the memory 110 of the MRI apparatus 100 or a pulse sequence received from an external device (not shown).

The controller 120 according to an embodiment may obtain an MR signal for the object, based on the pulse sequence. The controller 120 may store the MR signal in the form of k-space data in the memory 110.

For example, the MR signal may be a signal received from the scanner (not shown). The MR signal may be received from the memory 110 of the MRI apparatus 100 or from an external device (not shown).

The pulse sequence may include a gradient echo (GRE) sequence, a spin echo (SE) sequence, a fast spin echo (FSE) sequence, a single shot FSE, a fluid attenuated inversion recovery (FLAIR) sequence, a Gradient- and Spin-Echo (GRASE) sequence, and the like.

The controller 120 may obtain an image of the object, based on the obtained MR signal for the object. The controller 120 may include a module for reconstructing the MR image.

The controller 120 according to an embodiment may control an RF pulse of one cycle to be applied to the object during a repetition time TR including a first obtaining section and a second obtaining section.

The RF pulse of one cycle may include at least one of the aforementioned pulse sequences. According to an embodiment, the RF pulse of one cycle may include a GRE sequence, an FSE sequence, and the like.

The controller 120 may obtain an MR signal for a plurality of slices during the repetition time TR.

During the first obtaining section, a first inversion RF pulse for a first slice of the object may be applied.

The controller 120 may obtain a first MR signal for capturing a first MR image of the first slice, during the first obtaining section. The controller 120 may obtain a second MR signal for capturing at least one second MR image of a second slice of the object adjacent to the first slice, during the first obtaining section. The controller 120 may obtain a third MR signal for capturing at least one third MR image of the first slice, during the first obtaining section.

The controller 120 may sequentially obtain the first MR signal, the second MR signal, and the third MR signal, during the first obtaining section.

According to an embodiment, the first MR image may include a T2* weighted image. The at least one second MR image may include a proton density (PD) image and a T2 weighted image. The at least one third MR image may include an inversion recovery proton density (PDIR) image and a FLAIR image. According to an embodiment, the controller 120 may obtain the second MR signal during an inversion time based on the first inversion RF pulse.

The inversion time may be a time period from when the first inversion RF pulse is applied until an MR signal for a fluid (e.g., a cerebral spinal fluid (CSF)) portion of the object is minimized. In detail, the MRI apparatus 100 may apply pulses for obtaining the third MR signal, after applying the first inversion RF pulse to the object and then minimizing an undesired signal after the inversion time has lapsed.

The second MR signal is a signal for capturing the second MR image of the second slice, and the first inversion RF pulse and the third MR signal are signals for capturing the at least one third MR image of the first slice.

Because the second MR signal is a signal for the second slice, the second MR signal is not affected by the first inversion RF pulse for the first slice, and accordingly, may be obtained even when a sufficient period of time does not lapse after the first inversion RF pulse is applied.

The MRI apparatus 100 may shorten a scan time period by obtaining the at least one second MR image of the second slice during the inversion time after applying the first inversion RF pulse for the first slice to the object.

The controller 120 may obtain the second MR signal by using a dual echo sequence. The controller 120 may obtain a PD image and a T2 weighted image by view-sharing the second MR signal.

View sharing means equally using data corresponding to an RF from among pieces of k-space data when capturing a plurality of images having different contrasts by using a multi-echo sequence. At this time, data corresponding to a low frequency from among the pieces of k-space data for the plurality of images may be obtained during each effective echo time TE within the multi-echo sequence.

The third MR signal for capturing the at least one third MR image may be obtained after an inversion time TI is terminated and before the second obtaining t section starts. The first obtaining section may be included in a half of the repetition time, and the second obtaining section may be included in the remaining half of the repetition time.

The controller 120 may obtain the third MR signal by using a dual echo sequence. The controller 120 may obtain a PDIR image and a FLAIR image by view-sharing the third MR signal. The PDIR image may be a PD image of the first slice affected by the first inversion RF pulse.

The controller 120 according to an embodiment may obtain a T1 weighted image by using the PDIR image and the PD image. For example, when the value of an image signal of the PDIR image and the value of an image signal of the PD image are respectively represented by PDIR and PD and a signal of the T1 weighted image is represented by T1, the value of the signal of the T1 weighted image may be obtained using Equation 1.

$$T1=(PDIR*PD)/(PDIR^2+PD^2) \quad [\text{Equation 1}]$$

During the second obtaining section, a second inversion RF pulse for the second slice of the object may be applied.

The controller 120 may obtain a fourth MR signal for capturing a fourth MR image of the second slice, during the second obtaining section. The controller 120 may also obtain a fifth MR signal for capturing at least one fifth MR image of the first slice, during the second obtaining section. The controller 120 may also obtain a sixth MR signal for capturing at least one sixth MR image of the second slice, during the second obtaining section.

According to an embodiment, the controller 120 may obtain the fifth MR signal during an inversion time based on the second inversion RF pulse.

The MRI apparatus 100 of FIG. 1A may obtain images having various contrasts for the first slice and the second slice during the first obtaining section and the second obtaining section.

For example, the MRI apparatus 100 may obtain T2* weighted images, T2 weighted images, PD images, FLAIR images, and T1 weighted images of the first slice and the second slice, based on an MR signal obtained during a single repetition time.

In FIG. 1A, the MRI apparatus 100 obtains images of the first slice and the second slice. However, each of the first slice and the second slice is not limited to a single slice.

For example, the first slice may correspond to even-numbered slices, and the second slice may correspond to odd-numbered slices. Alternatively, the first slice may correspond to odd-numbered slices, and the second slice may correspond to even-numbered slices.

Figure 1B:
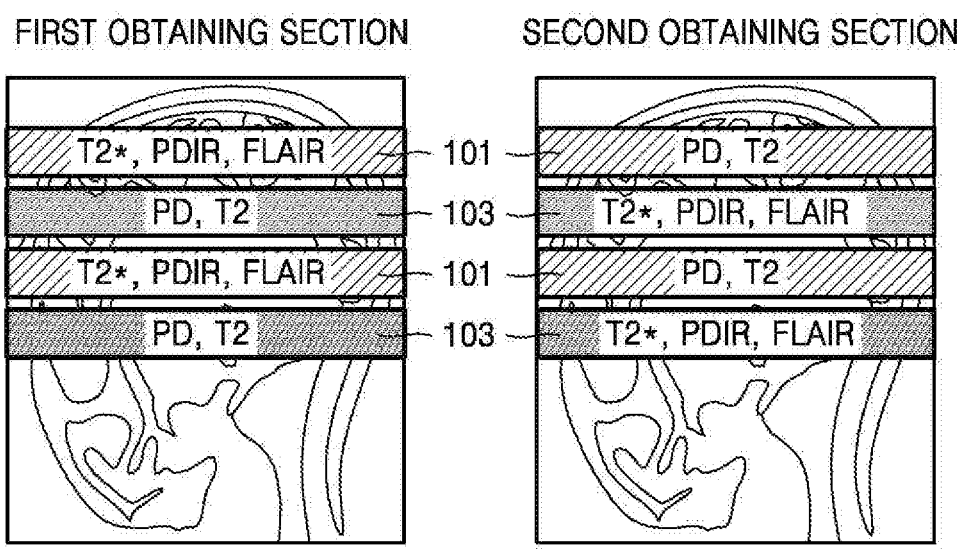
FIG. 1B schematically illustrates images obtained by the MRI apparatus of FIG. 1A, and cross-sections of the obtained images.

FIG. 1B schematically illustrates images obtained by the MRI apparatus 100, and cross-sections of the obtained images.

The MRI apparatus 100 of FIG. 1A may obtain images having different contrasts for a plurality of cross-sections by stimulating the plurality of cross-sections using a single pulse sequence according to a multi-band imaging method.

Referring to FIG. 1B, the MRI apparatus 100 may obtain images having different contrasts of a first slice corresponding to odd-numbered slices and of a second slice corresponding to even-numbered slices.

In detail, the MRI apparatus 100 may obtain a T2* weighted image, a PDIR image, and a FLAIR image of a first slice 101, during a first obtaining section. The MRI apparatus 100 may also obtain a PD image and a T2 weighted image of a second slice 103, during the first obtaining section.

The MRI apparatus 100 may also obtain a PD image and a T2 weighted image of the first slice 101, during a second obtaining section. The MRI apparatus 100 may also obtain a T2* weighted image, a PDIR image, and a FLAIR image of the second slice 103, during the second obtaining section.

Figure 2:
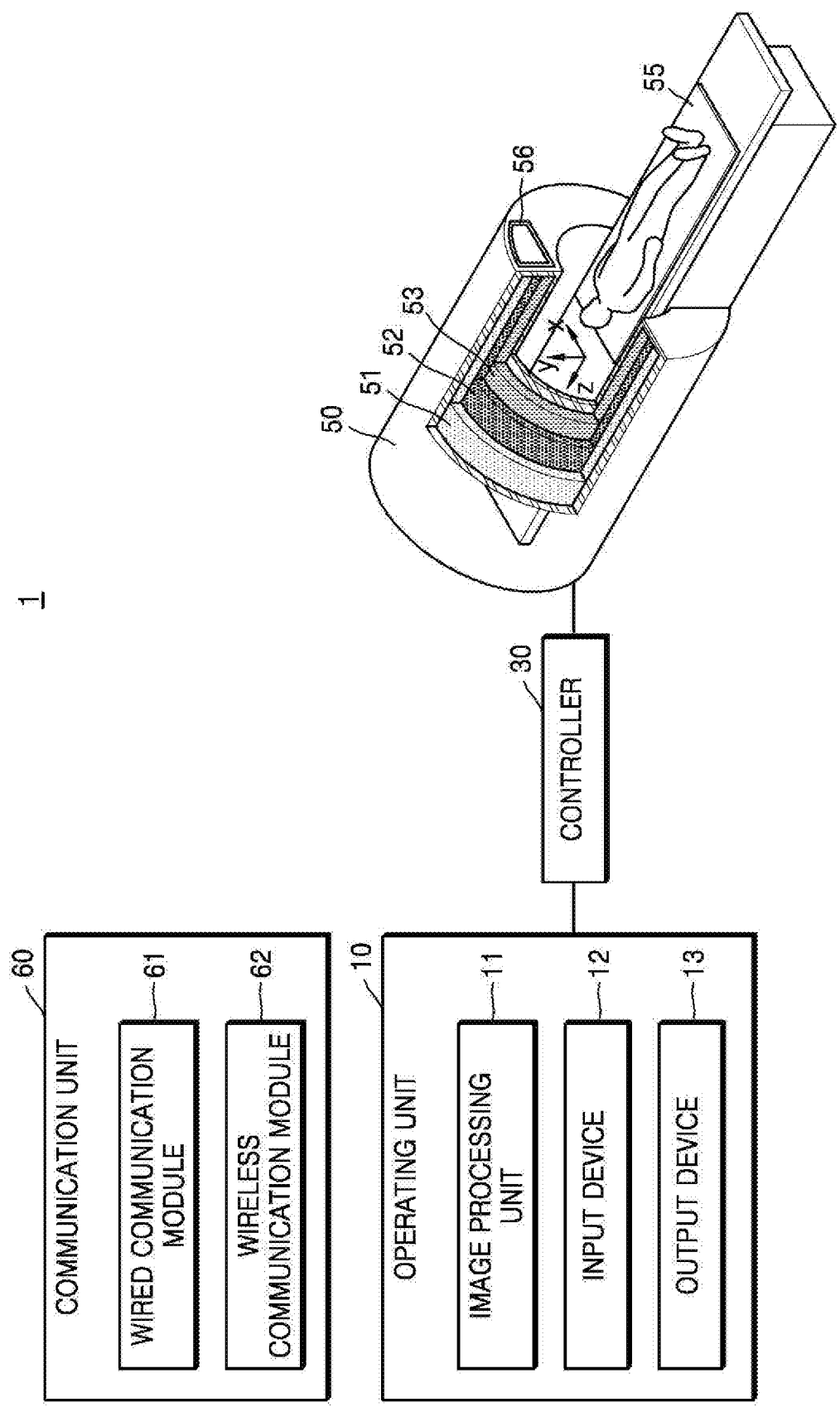
FIG. 2 is a schematic diagram of a general MRI system.

FIG. 2 is a schematic diagram of an MRI system 1.

Referring to FIG. 2, the MRI system 1 may include an operating unit 10, a controller 30, and a scanner 50. The controller 30 may be independently separated from the operating unit 10 and the scanner 50. Furthermore, the controller 30 may be separated into a plurality of sub-components and incorporated into the operating unit 10 and the scanner 50 in the MRI system 1. Operations of the components in the MRI system 1 will now be described in detail.

The scanner 50 may be formed to have a cylindrical shape (e.g., a shape of a bore) having an empty inner space into which an object may be inserted. A static magnetic field and a gradient magnetic field are created in the inner space of the scanner 50, and an RF signal is emitted toward the inner space.

The scanner 50 may include a static magnetic field generator 51, a gradient magnetic field generator 52, an RF coil unit 53, a table 55, and a display 56. The static magnetic field generator 51 creates a static magnetic field for aligning magnetic dipole moments of atomic nuclei of the object in a direction of the static magnetic field. The static magnetic field generator 51 may be formed as a permanent magnet or superconducting magnet using a cooling coil.

The gradient magnetic field generator 52 is connected to the controller 30 and generates a gradient magnetic field by applying a gradient to a static magnetic field in response to a control signal received from the controller 30. The gradient magnetic field generator 52 includes X, Y, and Z coils for generating gradient magnetic fields in X-, Y-, and Z-axis directions crossing each other at right angles and generates a gradient signal according to a position of a region being imaged so as to induce different resonance frequencies according to different regions of the object.

The RF coil unit 53 connected to the controller 30 may emit an RF signal toward the object in response to a control signal received from the controller 30 and receive an MR signal emitted from the object. In detail, the RF coil unit 53 may transmit, toward atomic nuclei of the object having precessional motion, an RF signal having the same frequency as that of the precessional motion, stop transmitting the RF signal, and then receive an MR signal emitted from the object.

The RF coil unit 53 may be formed as a transmitting RF coil for generating an electromagnetic wave having an RF corresponding to the type of an atomic nucleus, a receiving RF coil for receiving an electromagnetic wave emitted from an atomic nucleus, or one transmitting/receiving RF coil serving both functions of the transmitting RF coil and receiving RF coil. Furthermore, in addition to the RF coil unit 53, a separate coil may be attached to the object. Examples of the separate coil may include a head coil, a spine coil, a torso coil, and a knee coil according to a region being imaged or to which the separate coil is attached.

The display 56 may be disposed outside and/or inside the scanner 50. The display 56 is also controlled by the controller 30 to provide a user or the object with information related to medical imaging.

Furthermore, the scanner 50 may include an object monitoring information acquisition unit (not shown) configured to acquire and transmit monitoring information about a state of the object. For example, the object monitoring information acquisition unit may acquire monitoring information related to the object from a camera (not shown) for capturing images of a movement or position of the object, a respiration measurer (not shown) for measuring the respiration of the object, an ECG measurer for measuring the electrical activity of the heart, or a temperature measurer for measuring a temperature of the object and transmit the acquired monitoring information to the controller 30. The controller 30 may in turn control an operation of the scanner 50 based on the monitoring information. Operations of the controller 30 will now be described in more detail.

The controller 30 may control overall operations of the scanner 50.

The controller 30 may control a sequence of signals formed in the scanner 50. The controller 30 may control the gradient magnetic field generator 52 and the RF coil unit 53 according to a pulse sequence received from the operating unit 10 or a designed pulse sequence.

A pulse sequence may include all pieces of information required to control the gradient magnetic field generator 52 and the RF coil unit 53. For example, the pulse sequence may include information about a strength, a duration, and application timing of a pulse signal applied to the gradient magnetic field generator 52.

The controller 30 may control a waveform generator (not shown) for generating a gradient wave, i.e., an electrical pulse according to a pulse sequence and a gradient amplifier (not shown) for amplifying the generated electrical pulse and transmitting the same to the gradient magnetic field generator 52. Thus, the controller 30 may control formation of a gradient magnetic field by the gradient magnetic field generator 52.

Furthermore, the controller 30 may control an operation of the RF coil unit 53. For example, the controller 30 may supply an RF pulse having a resonance frequency to the RF coil unit 30 that emits an RF signal toward the object, and receive an MR signal received by the RF control unit 53. In this case, the controller 30 may adjust emission of an RF signal and reception of an MR signal according to an operating mode by controlling an operation of a switch (e.g., a T/R switch) for adjusting transmitting and receiving directions of the RF signal and the MR signal based on a control signal.

The controller 30 may control a movement of the table 55 where the object is placed. Before MRI is performed, the controller 30 may move the table 55 according to which region of the object is to be imaged.

The controller 30 may also control the display 56. For example, the controller 30 may control the on/off state of the display 56 or a screen to be output on the display 56 according to a control signal.

The controller 30 may be formed as an algorithm for controlling operations of the components in the MRI system 1, a memory (not shown) for storing data in the form of a program, and a processor for performing the above-described operations by using the data stored in the memory. In this case, the memory and the processor may be implemented as separate chips. Alternatively, the memory and processor may be incorporated into a single chip.

The operating unit 10 may control overall operations of the MRI system 1 and include an image processing unit 11, an input device 12, and an output device 13.

The operating unit 10 may further include the memory 110 of FIG. 1A.

The image processing unit 11 may control the memory to store an MR signal received from the controller 30, and generate image data with respect to the object from the stored MR signal by applying an image reconstruction technique by using an image processor.

For example, if a k space (for example, also referred to as a Fourier space or a frequency space) of the memory is filled with digital data to complete k-space data, the image processing unit 11 may reconstruct image data from the k-space data by applying various image reconstruction techniques (e.g., by performing inverse Fourier transform on the k-space data) by using the image processor.

Furthermore, the image processing unit 11 may perform various signal processing operations on MR signals in parallel. For example, the image processing unit 11 may perform a signal process on a plurality of MR signals received by a multi-channel RF coil in parallel so as to rearrange the plurality of MR signals into image data. In addition, the image processing unit 11 may store the image data in the memory, or the controller 30 may store the same in an external server via a communication unit 60 as will be described below.

The image processing unit 11 may include the controller 120 of FIG. 1A.

The input device 12 may receive, from the user, a control command for controlling the overall operations of the MRI system 1. For example, the input device 12 may receive, from the user, object information, parameter information, a scan condition, and information about a pulse sequence. The input device 12 may be a keyboard, a mouse, a track ball, a voice recognizer, a gesture recognizer, a touch screen, or any other input device.

The output device 13 may output image data generated by the image processing unit 11. The output device 13 may also output a user interface (UI) configured so that the user may input a control command related to the MRI system 1. The output device 13 may be formed as a speaker, a printer, a display, or any other output device.

Furthermore, although FIG. 2 shows that the operating unit 10 and the controller 30 are separate components, the operating unit 10 and the controller 30 may be included in a single device as described above. Furthermore, processes respectively performed by the operating unit 10 and the controller 30 may be performed by another component. For example, the image processing unit 11 may convert an MR signal received from the controller 30 into a digital signal, or the controller 30 may directly perform the conversion of the MR signal into the digital signal.

The MRI system 1 may further include a communication unit 60 and be connected to an external device (not shown) such as a server, a medical apparatus, and a portable device (e.g., a smartphone, a tablet PC, a wearable device, etc.) via the communication unit 60.

The communication unit 60 may include at least one component that enables communication with an external device. For example, the communication unit 60 may include at least one of a local area communication module (not shown), a wired communication module 61, and a wireless communication module 62.

The communication unit 60 may receive a control signal and data from an external device and transmit the received control signal to the controller 30 so that the controller 30 may control the MRI system 1 according to the received signal.

Alternatively, by transmitting a control signal to an external device via the communication unit 60, the controller 30 may control the external device according to the control signal.

For example, the external device may process data of the external device according to a control signal received from the controller 30 via the communication unit 60.

A program for controlling the MRI system 1 may be installed on the external device and may include instructions for performing some or all of the operations of the controller 30.

The program may be preinstalled on the external device, or a user of the external device may download the program from a server providing an application for installation. The server providing an application may include a recording medium having the program recorded thereon.

Figure 3:
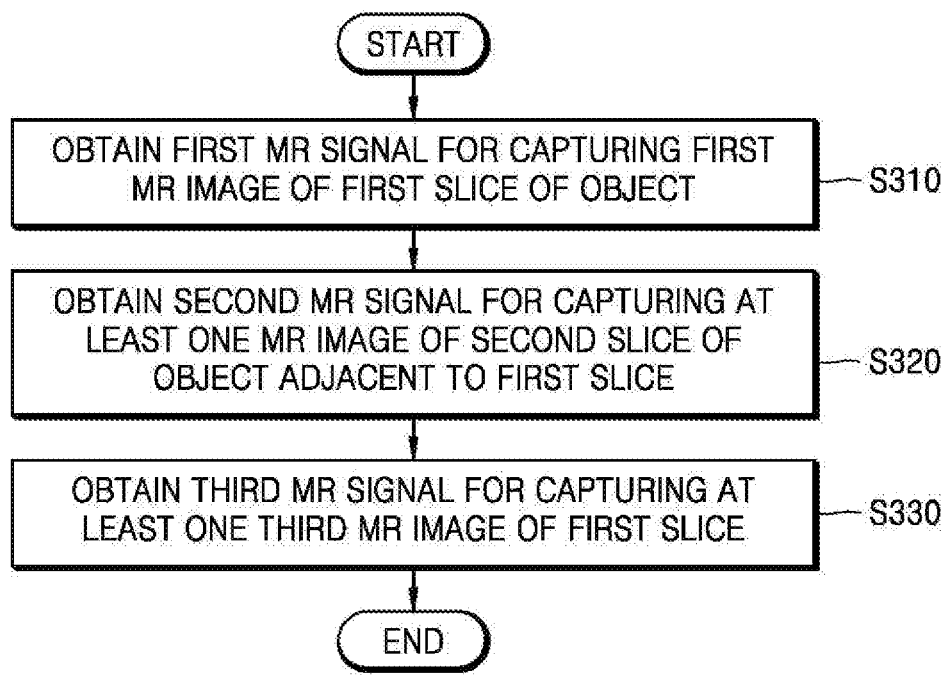
FIG. 3 is a flowchart of a method of obtaining an MR image, according to an embodiment.

FIG. 3 is a flowchart of a method of obtaining an MR image, according to an embodiment.

The method of obtaining the MR image according to an embodiment may be performed by the MRI apparatus 100. The MRI apparatus 100 may provide an RF pulse of one cycle during the repetition time TR including the first obtaining section and the second obtaining section.

In operation S310, the MRI apparatus 100 may obtain the first MR signal for capturing the first MR image of the first slice of the object.

In operation S320, the MRI apparatus 100 may obtain the second MR signal for capturing the at least one second MR image of the second slice of the object adjacent to the first slice.

The MRI apparatus 100 may obtain the second MR signal during the inversion time based on the first inversion RF pulse, after applying the first inversion RF pulse to the first slice.

In operation S330, the MRI apparatus 100 may obtain the third MR signal for capturing the at least one third MR image of the first slice of the object.

Figure 4:
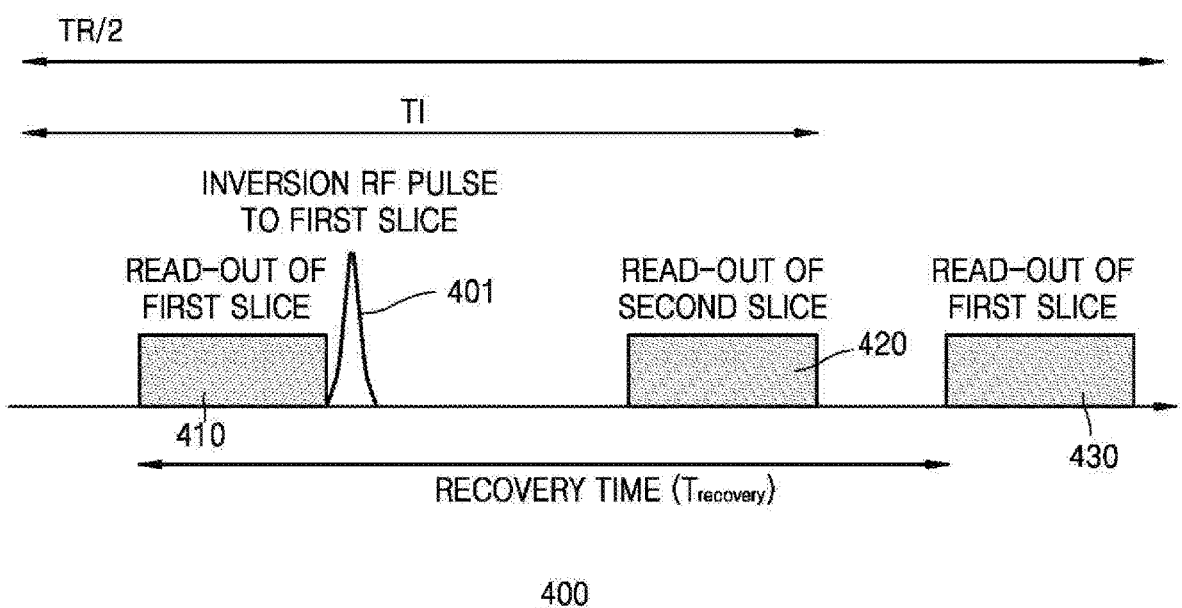
FIG. 4 is a diagram for explaining a portion of a pulse sequence provided by the MRI apparatus of FIG. 1A, according to an embodiment.

FIG. 4 is a diagram for explaining a portion of a pulse sequence provided by the MRI apparatus 100 according to an embodiment.

A pulse sequence diagram 400 of FIG. 4 represents a pulse sequence, which is provided by the MRI apparatus 100, during the first obtaining section included in the repetition time TR. According to an embodiment, the first obtaining section may correspond to a half of the repetition time.

A first pulse sequence 410, a second pulse sequence 420, and a third pulse sequence 430 represented by the pulse sequence diagram 400 may each correspond to at least one of a GRE sequence, an FSE sequence, and a FLAIR sequence.

The MRI apparatus 100 may apply the first pulse sequence 410 to a first slice before applying an inversion RF pulse 401 to the first slice. The first pulse sequence 410 may be, for example, a GRE sequence. Alternatively, the first pulse sequence 410 may be an echo planar image (EPI) sequence.

The MRI apparatus 100 may obtain a first MR signal for capturing a first MR image of the first slice, based on the first pulse sequence 410. For example, the first MR image may include a T2* weighted image.

According to an embodiment, when the first pulse sequence 410 is a GRE sequence for obtaining a T2* weighted image, the first pulse sequence 410 may include RF pulses having small flip angles. Accordingly, a relatively short recovery time $T_{recovery}$ for the first slice may be taken. Recovery time $T_{recovery}$ for the first slice may range from after the first pulse sequence 410 is applied to the first slice and before the third pulse sequence 430 is applied to the first slice. When the first pulse sequence 410 includes RF pulses having small flip angles, application of the first pulse sequence 410 may not greatly affect the contrast of an MR image obtained by the third pulse sequence 430.

According to an embodiment, the first pulse sequence 410 may be arranged before the third pulse sequence 430.

According to an embodiment, the MRI apparatus 100 may apply the inversion RF pulse 401 to the first slice and then apply the second pulse sequence 420 to a second slice. The second pulse sequence 420 may be, for example, an FSE sequence. The MRI apparatus 100 may obtain a second MR signal for capturing at least one second MR image of the second slice, based on the second pulse sequence 420. For example, the at least one second MR image may include a T2 weighted image. Alternatively, the at least one second MR image may include a T2 weighted image and a PD image.

The MRI apparatus 100 may apply the second pulse sequence 420 within the inversion time TI. The inversion time TI may be about 2.5 seconds if the MRI apparatus 100 operates in a magnetic field of 3T.

According to an embodiment, the MRI apparatus 100 may apply the third pulse sequence 430 to the first slice after the inversion time TI has lapsed. The third pulse sequence 430 may be, for example, an FSE sequence. The MRI apparatus 100 may obtain a third MR signal for capturing at least one third MR image of the first slice, based on the third pulse sequence 430. The MRI apparatus 100 may capture a FLAIR image and a PDIR image, based on the third MR signal.

Figure 5:
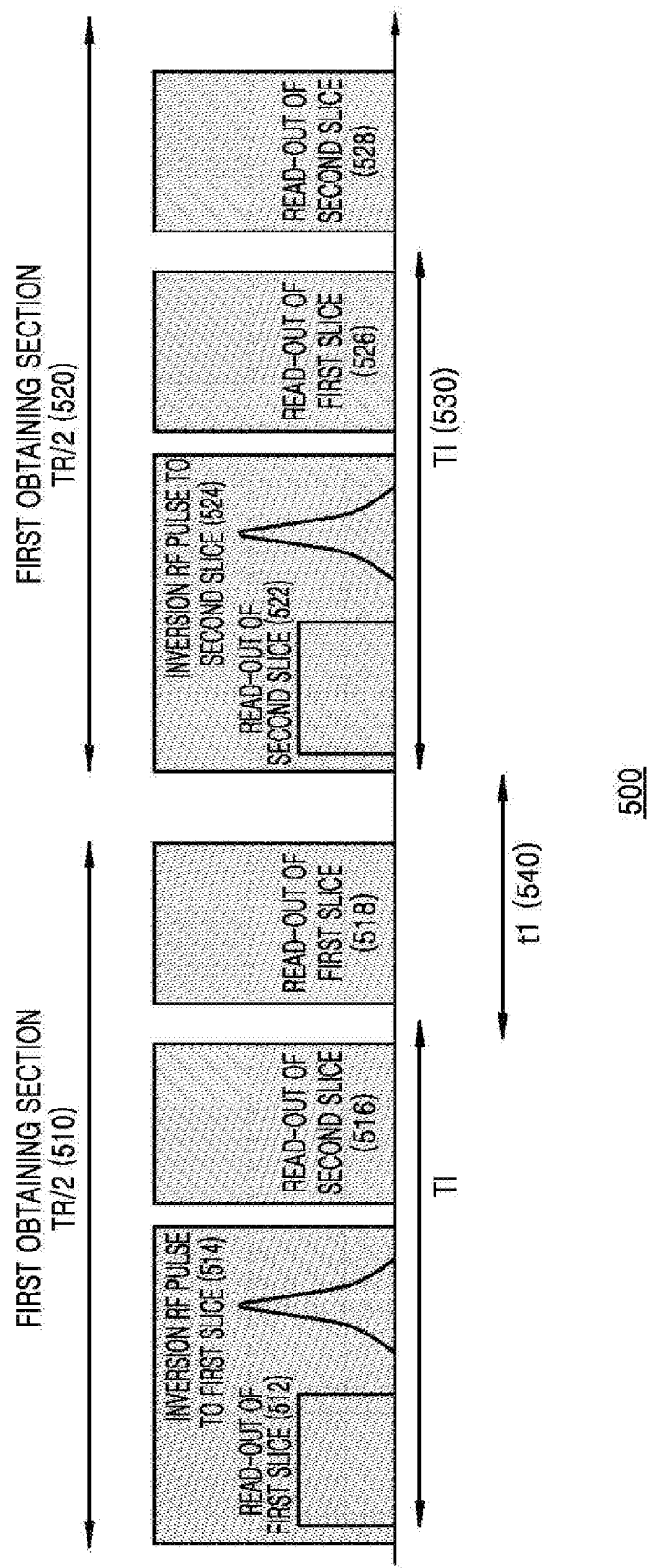
FIG. 5 is a diagram for explaining a pulse sequence provided by the MRI apparatus of FIG. 1A, according to an embodiment.

FIG. 5 is a diagram for explaining a pulse sequence provided by the MRI apparatus 100 according to an embodiment.

A pulse sequence diagram 500 of FIG. 5 represents a pulse sequence, which is provided by the MRI apparatus 100, during a first obtaining section 510 and a second obtaining section 520 included in a repetition time TR.

According to an embodiment, the first obtaining section 510 may correspond to a half of the repetition time TR, and the second obtaining section 520 may correspond to the remaining half of the repetition time TR.

Because a first pulse sequence 512, a first inversion RF pulse 514, a second pulse sequence 516, and a third pulse sequence 518 applied during the first obtaining section 510 correspond to those described above with reference to FIG. 4, descriptions thereof will be omitted.

Referring to the pulse sequence diagram 500 of FIG. 5, during the second obtaining section 520 after the first obtaining section 510, a fourth pulse sequence 522, a second inversion RF pulse 524, a fifth pulse sequence 526, and a sixth pulse sequence 528 may be applied.

The fourth pulse sequence 522, the fifth pulse sequence 526, and the sixth pulse sequence 528 may each correspond to at least one of a GRE sequence, an FSE sequence, and a FLAIR sequence.

In detail, referring to FIG. 5, the MRI apparatus 100 may apply the fourth pulse sequence 522 to the second slice before applying the second inversion RF pulse 524 to the second slice. The fourth pulse sequence 522 may be, for example, a GRE sequence. Alternatively, the fourth pulse sequence 522 may be an EPI sequence.

The MRI apparatus 100 may obtain a fourth MR signal for capturing a fourth MR image of the second slice, based on the fourth pulse sequence 522. For example, the fourth MR image may include a T2* weighted image.

The MRI apparatus 100 may obtain a fifth MR signal for capturing at least one fifth MR image of the first slice, based on the fifth pulse sequence 526. The at least one fifth MR image may include a T2 weighted image. Alternatively, the at least one fifth MR image may include a T2 weighted image and a PD image.

According to an embodiment, the MRI apparatus 100 may obtain the fifth MR signal for the first slice during an inversion time 530 based on the second inversion RF pulse 524. The inversion time 530 may be about 2.5 seconds if the MRI apparatus 100 operates in a magnetic field of 3T.

According to an embodiment, after the inversion time 530 has lapsed, the MRI apparatus 100 may obtain a sixth MR signal for capturing at least one sixth MR image of the second slice, based on the sixth pulse sequence 528. The MRI apparatus 100 may capture a FLAIR image and a PDIR image of the second slice, based on the sixth MR signal 528.

According to an embodiment, the MRI apparatus 100 may obtain a T1 weighted image of the second slice by using a PD image of the second slice and the PDIR image of the second slice.

For example, the PD image of the second slice may be obtained based on an MR signal obtained during the first obtaining section 510. The PDIR image of the second slice may be obtained based on an MR signal obtained during the second obtaining section 520.

Referring to FIG. 5, a time period from when the second pulse sequence 516 included in the first obtaining section 510 is applied to the second slice until an influence of the applied second pulse sequence 516 is ignorable may be referred to as t1 (540).

Accordingly, the fourth pulse sequence 522 included in the second obtaining section 520 may be applied to the second slice after the lapse of t1 (540) after the second pulse sequence 516 included in the first obtaining section 510 is applied to the second slice.

According to an embodiment, the MRI apparatus 100 may obtain MR images having various contrasts for the first slice and the second slice, based on an MR signal obtained during the repetition time TR including the first obtaining section 510 and the second obtaining section 520.

For example, the MRI apparatus 100 may obtain T2* weighted images, T2 weighted images, PD images, FLAIR images, and T1 weighted images of the first slice and the second slice, during a single repetition time.

According to an embodiment, the MRI apparatus 100 may reduce the time taken to obtain a T2* weighted image, a T2 weighted image, a PD image, a FLAIR image, and a T1 weighted image by about a half of the time taken when using respective pulse sequences for these images.

Figure 6:
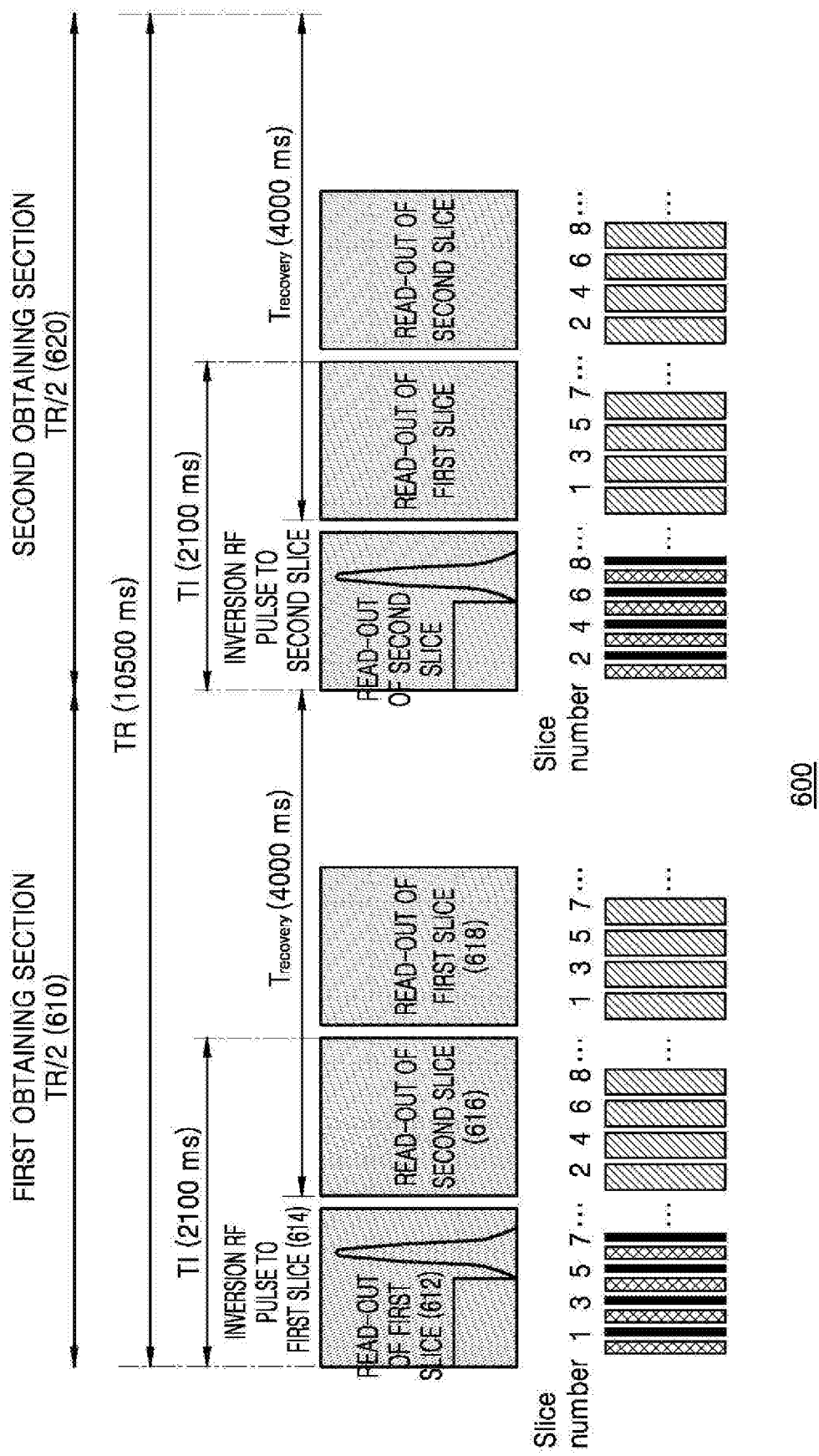
FIG. 6 is a diagram for explaining a method, performed by the MRI apparatus of FIG. 1A, of obtaining an MR image, according to an embodiment.

FIG. 6 is a diagram for explaining a method, performed by the MRI apparatus 100, of obtaining an MR image, according to an embodiment.

A pulse sequence diagram 600 of FIG. 6 represents a pulse sequence, which is provided by the MRI apparatus 100, during a first obtaining section 610 and a second obtaining section 620 included in a repetition time TR.

In the pulse sequence diagram 600 of FIG. 6, a first slice may correspond to odd-numbered slices (No. 1 slice, No. 3 slice, No. 5 slice, through to . . . No. n−1 slice) and a second slice may correspond to even-numbered slices (No. 2 slice, No. 4 slice, No. 6 slice, . . . through to No. n slice). In this case, pulse sequences included in the pulse sequence diagram 600 may be applied to all slices desired to be obtained.

For example, when the MRI apparatus 100 applies pulse sequences included in the first obtaining section 610, the MRI apparatus 100 may apply the pulse sequences included in the first obtaining section 610 to the first slice in the order of a first pulse sequence 612 to the No. 1 slice, an inversion RF pulse 614 to the No. 1 slice, the first pulse sequence 612 to the No. 3 slice, the inversion RF pulse 614 to the No. 3 slice, the first pulse sequence 612 to the No. 5 slice, the inversion RF pulse 614 to the No. 5 slice, . . . , the first pulse sequence 612 to the No. n−1 slice, and the inversion RF pulse 614 to the No. n−1 slice.

When the MRI apparatus 100 applies a second pulse sequence 616, the MRI apparatus 100 may apply the second pulse sequence 616 to the second slice in the order of the No. 2 slice, the No. 4 slice, through to the No. n slice.

When the MRI apparatus 100 applies a third pulse sequence 618, the MRI apparatus 100 may apply the third pulse sequence 618 to the first slice in the order of the No. 1 slice, the No. 3 slice, the No. 5 slice, through to the No. n−1 slice.

Referring to FIG. 6, a recovery time $T_{recovery}$ for the second slice may be, for example, 4000 ms. The recovery time $T_{recovery}$ for the second slice ranges from after the second pulse sequence 616 is applied to the second slice to before the second slice is read out at the second obtaining section 620. An inversion time TI based on the inversion RF pulse 614 may be, for example, 2100 ms.

Figure 7:
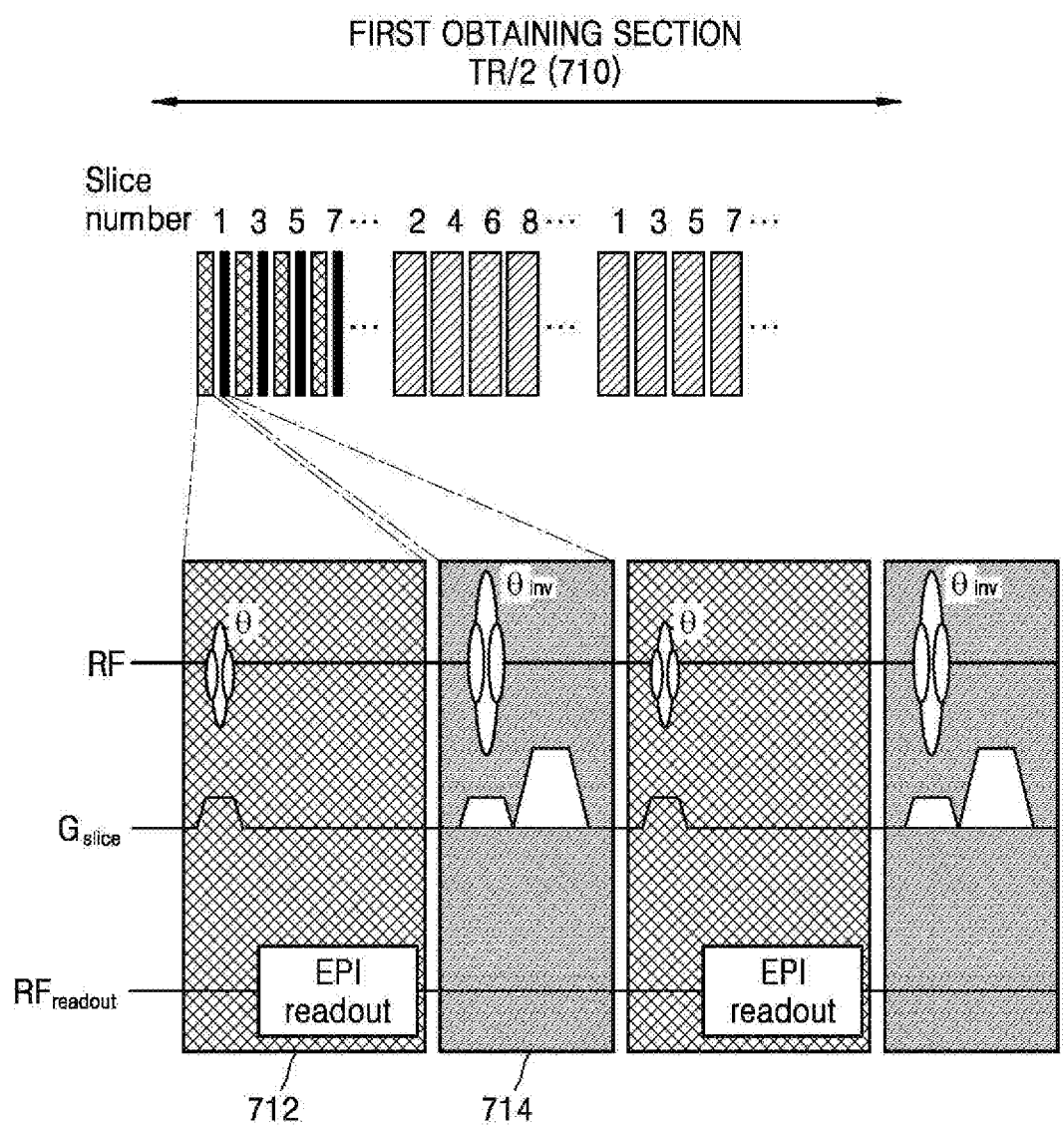
FIG. 7 is a diagram for explaining a method, performed by the MRI apparatus of FIG. 1A, of obtaining an MR image, according to an embodiment.

FIG. 7 is a diagram for explaining a method, performed by the MRI apparatus 100, of obtaining an MR image, according to an embodiment.

FIG. 7 illustrates, in detail, obtainment of an MR image based on a first pulse sequence 712 and an inversion RF pulse 714 by the MRI apparatus 100 during a first obtaining section 710.

The MRI apparatus 100 may obtain a first MR image by applying the first pulse sequence 712. The first MR image obtained based on the first pulse sequence 712 may include a T2* weighted image.

For example, the MRI apparatus 100 may apply the first pulse sequence 712 to No. 1 slice before applying the inversion RF pulse 714 to No. 1 slice. The first pulse sequence 712 may be, for example, a GRE sequence. Alternatively, the first pulse sequence 712 may be an EPI sequence. The inversion RF pulse 714 may include a 180-degree pulse.

When the applications of the first pulse sequence 712 and the inversion RF pulse 714 to No. 1 slice are completed, the MRI apparatus 100 applies the first pulse sequence 712 and the inversion RF pulse 714 to No. 3 slice.

The inversion RF pulse 714 may be used when obtaining later a third MR signal for obtaining a FLAIR image and a PDIR image of a first slice.

Figure 8:
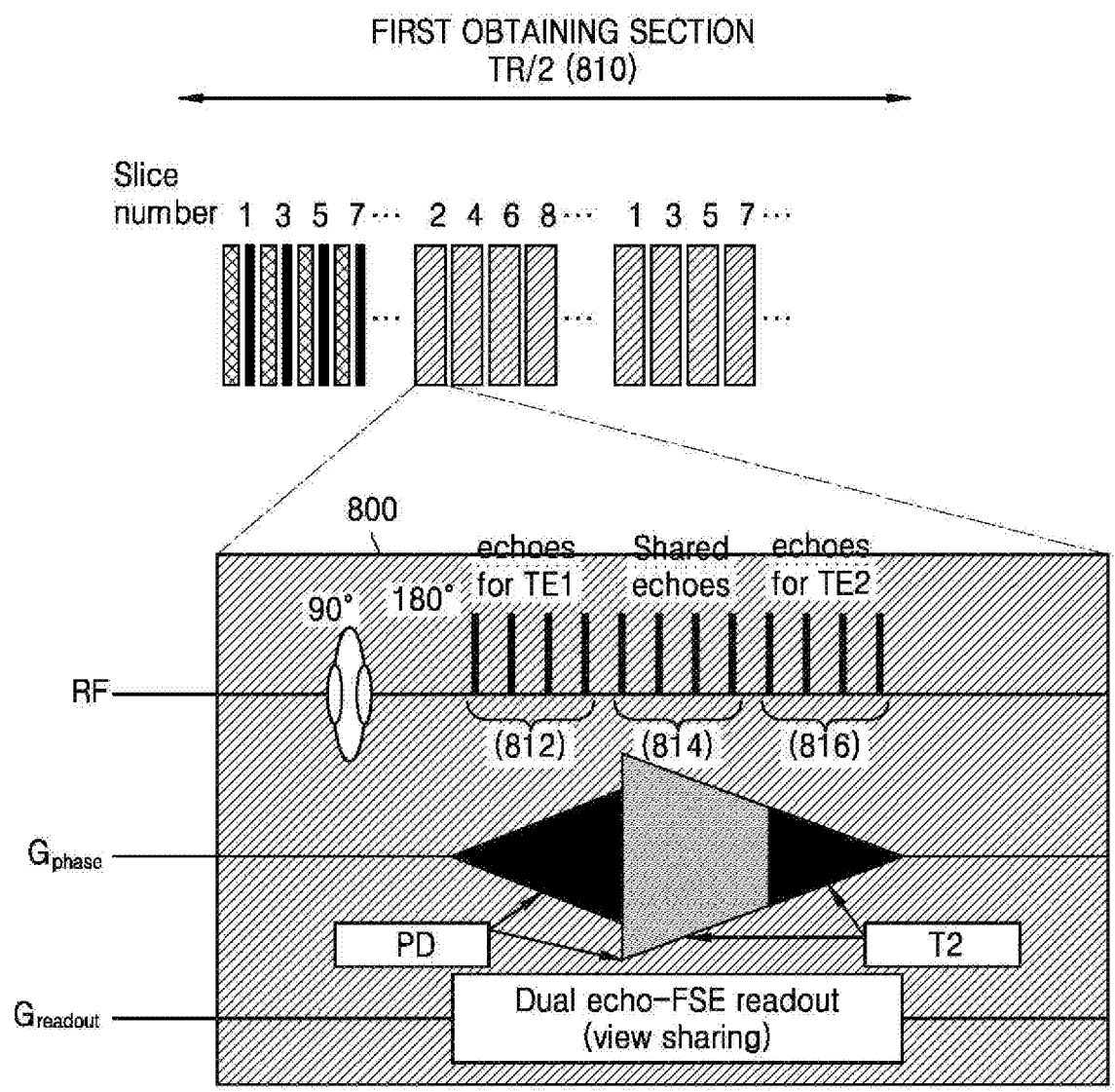
FIG. 8 is a diagram for explaining a method, performed by the MRI apparatus of FIG. 1A, of obtaining an MR image, according to an embodiment.

FIG. 8 is a diagram for explaining a method, performed by the MRI apparatus 100, of obtaining an MR image, according to an embodiment.

FIG. 8 illustrates, in detail, obtainment of an MR image based on a dual echo FSE sequence by the MRI apparatus 100 during a first obtaining section 810.

The MRI apparatus 100 may obtain a second MR signal, based on the dual echo FSE sequence. The MRI apparatus 100 may obtain a PD image and a T2 weighted image by view-sharing the second MR signal, based on the dual echo FSE sequence.

When the MRI apparatus 100 obtains a plurality of images having different contrasts via view sharing, the MRI apparatus 100 may obtain data corresponding to an RF from among pieces of k-space data for the plurality of images only once, and may obtain data corresponding to a low frequency from among the pieces of k-space data during each effective echo time TE within a multi-echo sequence.

Referring to FIG. 8, the MRI apparatus 100 applies a second pulse sequence 800 to obtain a second MR signal for a second slice.

The MRI apparatus 100 may obtain a PD image and a T2 weighted image, based on the second pulse sequence 800, while using view-sharing.

The second pulse sequence 800 according to an embodiment may be used to obtain images having two contrasts corresponding to two effective echo times, and may be referred to as a dual echo sequence.

For example, referring to FIG. 8, an echo train length (ETL), which is the total number of echoes included in one cycle of the second pulse sequence 800, may be 12.

Four initial echoes may be echoes for obtaining k-space data corresponding to an effective echo time TE1. Four last echoes may be echoes for obtaining k-space data corresponding to an effective echo time TE2.

Four middle echoes are the data corresponding to the RF from among the pieces of k-space data, and may be used to obtain k-space data that is shared when obtaining images having two contrasts.

The MRI apparatus 100 may obtain a PD image and a T2 weighted image corresponding to the effective echo times TE1 and TE2, by adjusting a phase gradient Gphase.

Although not shown in FIG. 8, similar to the method of obtaining the PD image and the T2 weighted image, the MRI apparatus 100 may obtain a PDIR image and a FLAIR image by view-sharing a third MR signal, based on a dual echo FSE sequence.

According to the disclosed embodiments, a scan time period may be reduced by obtaining a plurality of MR images having different contrasts by using a single pulse sequence.

According to the disclosed embodiments, images having different contrasts for a plurality of cross-sections may be obtained by stimulating the plurality of cross-sections by using a single pulse sequence according to a multi-band imaging method.

Embodiments may be implemented through non-transitory computer-readable recording media having recorded thereon computer-executable instructions and data. The instructions may be stored in the form of program codes, and when executed by a processor, generate a predetermined program module to perform a specific operation. Furthermore, when being executed by the processor, the instructions may perform specific operations according to the embodiments.

While one or more embodiments have been described with reference to the figures, it will be understood by those of ordinary skill in the art that various changes in form and details may be made therein without departing from the spirit and scope of the present disclosure as defined by the following claims. Accordingly, the above embodiments and all aspects thereof are examples only and are not limiting.

What is claimed is:

1. A magnetic resonance imaging (MRI) apparatus comprising:
a controller configured to control a pulse sequence of one cycle to be applied to a plurality of slices of an object, wherein the one cycle comprises a first obtaining section during which a first inversion radio frequency (RF) pulse is applied to a first slice from among the plurality of slices of the object and a second obtaining section during which a second inversion RF pulse is applied to a second slice from among the plurality of slices of the object, the second slice being adjacent to the first slice, the controller being further configured to sequentially obtain a first MR signal for capturing a first MR image of the first slice, a second MR signal for capturing at least one second MR image of the second slice adjacent to the first slice, and a third MR signal for capturing at least one third MR image of the first slice,
wherein the first MR signal, the second MR signal, and the third MR signal are obtained during the first obtaining section,
wherein the first MR image, the at least one second MR image, and the at least one third MR image have mutually different contrasts.

2. The MRI apparatus of claim 1, wherein
the controller is further configured to obtain the first MR signal based on a gradient echo (GRE) signal, and
the first MR image comprises a T2* weighted image.

3. The MRI apparatus of claim 1, wherein the second MR signal is obtained during an inversion time based on the first inversion RF pulse.

4. The MRI apparatus of claim 1, wherein
the at least one second MR image comprises a proton density (PD) image and a T2 weighted image, and
the controller is further configured to obtain the second MR signal according to a dual echo sequence and to obtain the PD image and the T2 weighted image by view-sharing the second MR signal.

5. The MRI apparatus of claim 1, wherein
the at least one third MR image comprises an inversion recovery proton density (PDIR) image and a fluid attenuated inversion recovery (FLAIR) image, and
the controller is further configured to obtain the third MR signal according to a dual echo sequence and to obtain the PDIR image and the FLAIR image by view-sharing the third MR signal.

6. The MRI apparatus of claim 1, wherein the controller is further configured to obtain the third MR signal after an inversion time terminates and before the second obtaining section starts.

7. The MRI apparatus of claim 1, wherein
the one cycle corresponds to a repetition time (TR),
the first obtaining section is included in a first half of the TR, and
the second obtaining section is included in a second half of the TR.

8. The MRI apparatus of claim 1, wherein the controller is further configured to sequentially obtain a fourth MR signal for capturing a fourth MR image of the second slice, a fifth MR signal for capturing at least one fifth MR image of the first slice, and a sixth MR signal for capturing a sixth MR image of the second slice,
wherein the fourth MR signal, the fifth MR signal, and the sixth MR signal are obtained during the second obtaining section.

9. The MRI apparatus of claim 8, wherein
the controller is further configured to obtain the fourth MR signal based on a GRE signal, and
the fourth MR image comprises a T2* weighted image.

10. The MRI apparatus of claim 8, wherein the fifth MR signal is obtained during an inversion time based on the second inversion RF pulse.

11. The MRI apparatus of claim 8, wherein
the at least one fifth MR image comprises a PD image and a T2 weighted image, and
the controller is further configured to obtain the fifth MR signal according to a dual echo sequence and to obtain the PD image and the T2 weighted image by view-sharing the fifth MR signal.

12. The MRI apparatus of claim 8, wherein
the at least one sixth MR image comprises a PDIR image and a FLAIR image, and
the controller is further configured to obtain the sixth MR signal according to a dual echo sequence and to obtain the PDIR image and the FLAIR image by view-sharing the sixth MR signal.

13. A method of obtaining a magnetic resonance (MR) image, the method comprising:
controlling a pulse sequence of one cycle to be applied to a plurality of slices of an object, wherein the one cycle comprises a first obtaining section during which a first inversion radio frequency (RF) pulse is applied to a first slice from among the plurality of slices of the object and a second obtaining section during which a second inversion RF pulse is applied to a second slice from among the plurality of slices of the object adjacent to the first slice; and during the first obtaining section:

obtaining a first MR signal for capturing a first MR image of the first slice;

obtaining a second MR signal for capturing at least one second MR image of the second slice, the second slice being adjacent to the first slice; and obtaining a third MR signal for capturing at least one third MR image of the first slice, wherein the first MR image, the at least one second MR image, and the at least one third MR image have mutually different contrasts.

14. The method of claim 13, wherein the first MR signal is obtained based on a gradient echo (GRE) signal, and the first MR image comprises a T2* weighted image.

15. The method of claim 13, wherein the second MR signal is obtained during an inversion time based on the first inversion RF pulse.

16. The method of claim 13, wherein the at least one second MR image comprises a proton density (PD) image and a T2 weighted image, and the second MR signal is obtained based on a dual echo sequence, and the method further comprises obtaining the PD image and the T2 weighted image by view-sharing the second MR signal.

17. The method of claim 13, wherein the at least one third MR image comprises an inversion recovery proton density (PDIR) image and a fluid attenuated inversion recovery (FLAIR) image, and the third MR signal is obtained based on a dual echo sequence, and the method further comprises obtaining the PDIR image and the FLAIR image by view-sharing the third MR signal.

18. The method of claim 13, wherein the third MR signal is obtained after an inversion time terminates and before the second obtaining section starts.

19. The method of claim 13, wherein the one cycle corresponds to a repetition time (TR), the first obtaining section is included in a first half of the TR, and the second obtaining section is included in a second half of the TR.

20. A non-transitory computer-readable recording medium having recorded thereon a program for executing the method of claim 13.

* * * * *